(12) United States Patent
Scheucher et al.

(10) Patent No.: US 7,538,444 B2
(45) Date of Patent: May 26, 2009

(54) WAFER WITH OPTICAL CONTROL MODULES IN EXPOSURE FIELDS

(76) Inventors: Heimo Scheucher, Kogelbuchstrasse 23, A-8302 Langegg (AT); Guenther Pfeiler, Murfelderstrasse 209, A-8041 Graz (AT); Rik Wenting, Muldersweg 123, NL-6532 WZ Nijmegen (NL)

( * ) Notice: Subject to any disclaimer, the term of this patent is extended or adjusted under 35 U.S.C. 154(b) by 150 days.

(21) Appl. No.: 10/584,504

(22) PCT Filed: Dec. 9, 2004

(86) PCT No.: PCT/IB2004/052723

§ 371 (c)(1), (2), (4) Date: Jun. 22, 2006

(87) PCT Pub. No.: WO2005/064408

PCT Pub. Date: Jul. 14, 2005

(65) Prior Publication Data

US 2007/0152303 A1 Jul. 5, 2007

(30) Foreign Application Priority Data

Dec. 23, 2003 (EP) ................... 03104955

(51) Int. Cl.
*H01L 23/544* (2006.01)

(52) U.S. Cl. .............................. 257/797; 257/E23.179
(58) Field of Classification Search .................. 257/797, 257/798, E23.179
See application file for complete search history.

(56) References Cited

U.S. PATENT DOCUMENTS

| | | | | |
|---|---|---|---|---|
| 5,721,091 | A | * 2/1998 | Watanabe et al. | 430/323 |
| 6,005,294 | A | * 12/1999 | Tsuji et al. | 257/797 |
| 6,114,072 | A | 9/2000 | Narimatsu | |

\* cited by examiner

*Primary Examiner*—Evan Pert
*Assistant Examiner*—Kevin Quinto
(74) *Attorney, Agent, or Firm*—Peter Zawilski

(57) ABSTRACT

In a wafer (1) with a number of exposure fields (2), each of which exposure fields (2) comprising a number of lattice fields (3) with an IC (4) located therein, two groups (5, 7) of dicing paths (6, 8) are provided and four control module fields (A1, A2, A3, A4, B1, B2, B3, B4, C2, C4, D2, D4, E1, E3, F1, F3, G2, H1, J1) are assigned to each exposure field (2), each of which control module fields (A1, A2, A3, A4, B1, B2, B3, B4, C2, C4, D2, D4, E1, E3, F1, F3, G2, H1, J1) contains at least one optical control module (OCM-A1, OCMA2, OCM-A3, OCM-A4, OCM-B1, OCM-B2, OCM-B3, OCM-B4, OCM-C2, OCM-D4) and lies within the exposure field (2) in question and is provided in place of at least one lattice field (3) and is arranged at a mutual minimum distance (K).

7 Claims, 2 Drawing Sheets

WAFER WITH OPTICAL CONTROL MODULES IN EXPOSURE FIELDS

The invention relates to a wafer, which wafer comprises a number of exposure fields and which wafer comprises a number of lattice fields in each exposure field, wherein each lattice field contains an IC, and which wafer comprises a first group of first dicing paths and a second group of second dicing paths, wherein all of the first dicing paths of the first group run parallel to a first direction and have a first path width and wherein all of the second dicing paths of the second group run parallel to a second direction intersecting the first direction and have a second path width, and wherein the first dicing paths and the second dicing paths are provided and designed for a subsequent segregation of the lattice fields and the ICs contained therein, and wherein in each exposure field at least two control module fields are provided, each of which control module fields contains at least one optical control module.

Such a wafer according to the design described in the first paragraph is known, for instance, from patent specification U.S. Pat. No. 6,114,072 A, wherein the design described with reference to FIG. 21 deserves particular attention. The known wafer is so designed that a first control module field of each exposure field immediately adjoins a first edge of the exposure field in question and that a second control module field of each exposure field immediately adjoins the second edge of the exposure field in question. Each control module field lies in a half of a first dicing path. As a result of this design, a first control module field and a second control module field of the two exposure fields in question lie between two rows of lattice fields of two exposure fields, which are arranged immediately adjacent to one another in the second direction, so that the distance extending in the second direction between two rows of lattice fields of two exposure fields, which are arranged immediately adjacent to one another in the second direction, is determined by the double value of the width of a control module field. Owing to the fact that two such first control module fields lie between two rows of lattice fields of two exposure fields, which are arranged immediately adjacent to one another in the second direction, and of the fact that each control module field lies in a half of a first dicing path and two adjacent control module fields, therefore determine the width of a whole first dicing path and that all parallel dicing paths of a wafer, including the first dicing paths between the lattice fields within each exposure field, which run parallel to the first direction, must be of equal width if the stepper steps required in the production of the wafer and the production of the ICs are to be completed precisely in the testing, dicing and assembly phases, the first dicing paths running between the ICs of each exposure field also have to have the double width of the control module fields. As a result, a not insignificant proportion of the wafer surface is required for the totality of all dicing paths, which constitutes undesirable waste.

It is an object of the invention to eliminate the facts described above and to create an improved wafer.

To achieve this object, features according to the invention are provided in a wafer according to the invention, so that a wafer according to the invention can be characterized in the following way:

Wafer, which wafer comprises a number of exposure fields and which wafer comprises a number of lattice fields in each exposure field, wherein each lattice field contains an IC and each IC contains a plurality of IC components, and which wafer comprises a first group of first dicing paths and a second group of second dicing paths, wherein all of the first dicing paths of the first group run parallel to a first direction and have a first path width and wherein all of the second dicing paths of the second group run parallel to a second direction intersecting the first direction and have a second path width, and wherein the first dicing paths and the second dicing paths are provided and designed for a subsequent segregation of the lattice fields and the ICs contained therein, and wherein in each exposure field at least two control module fields are provided, each of which control module fields contains at least one optical control module, and wherein each control module field provided in an exposure field is provided in place of a preset number of lattice fields, and wherein the at least two control module fields of each exposure field are arranged at an average distance from one another extending in the second direction, which average distance is equal to at least a quarter of the side length of a side of the exposure field which extends in the second direction.

By the provision of the features according to the invention, it can be achieved in a simple way and without any additional costs that there is no control module field between two exposure fields immediately adjacent to one another in the second direction, so that the distance extending in the second direction between two exposure fields is determined only by the width of a first dicing path. As a result, the width of the dicing paths provided between adjacent lattice fields is expediently likewise determined by the width of a first dicing path only, so that the surface area of a wafer according to the invention can be utilized much better than that of a wafer according prior art. In a wafer according to prior art, the widths of the first dicing paths running between the lattice fields and of the control module fields are known to lie in the range between 90 µm and 120 µm, whereas in a wafer according to the invention—depending on the wafer manufacturing technology and the wafer process technology used—the widths of the first dicing paths and of the control module fields are or can be reduced to values between 80 µm and 20 µm or 15 µm or 10 µm respectively, whereby particularly thin saw blades are used for widths between 80 µm and 50 µm and the very small widths are subject to the precondition that so-called laser dicers are used for the subsequent segregation of the lattice fields or ICs, whereby so-called "red lasers" or "blue lasers" are used. The technologies known among experts under the names of "stealth dicing" and "scribe & break dicing" can also be applied. In a wafer according to the invention, a fraction of the wafer surface lying within the exposure fields is used to implement control modules rather than ICs, so that, of the portion of the wafer surface which lies within the exposure fields and which is provided for the implementation of ICs, the above-mentioned fraction of the wafer surface is lost in favor of the implementation of control modules. Nevertheless, a wafer according to the invention offers an overall gain in the wafer surface available for the implementation of ICs, because, by locating the control module fields and the control modules contained therein within the exposure fields, the dicing paths can be and therefore are designed so narrow that significantly more wafer surface is gained by the narrower dicing paths than is lost by locating the control modules within the exposure fields.

In a wafer according to the invention, the average distance can be equal to slightly more than a quarter (¼) or slightly less or slightly more than a half (½) or slightly less or slightly more than three quarters (¾) of the side length of a side of the exposure field which extends in the second direction. It has, however, been found to be particularly advantageous if the average distance is equal to the whole side length of a side of the exposure field which extends in the second direction minus the side length of a side of a lattice field which extends in the second direction. This ensures as large a distance as possible between the at least two control module fields of each exposure field, which is advantageous with regard to the highly precise execution of the process steps executable or executed while using the optical control modules.

It has been found to be particularly advantageous if each exposure field is rectangular, and if four control module fields are provided in each exposure field, and if each control module field is located in a corner region of the exposure field in question. This ensures a high precision in the process steps executed while utilizing the control modules or the control module components. It can further be mentioned that each exposure field can have the shape of a triangle, with a control module field located near each corner region or a control module field being provided near two corner regions only. It can be mentioned that only three control module fields can alternatively be provided, wherein each control module field is located in a corner region of the exposure field in question.

It has further been found to be particularly advantageous if each control module field provided in an exposure field is provided in place of one lattice field only. This offers a particularly expedient solution with regard to a maximum IC yield.

It should finally be mentioned that the use of the measures according to the invention has been or is found to be most useful if the wafer is provided and used for the implementation of ICs with an IC surface area of approximately 0.5 to 2.0 mm×0.5 to 2.0 mm, i.e. approximately 0.25 to 4.0 mm$^2$. It is further useful if the exposure fields are approximately 21.0 mm×21.0 mm in size and if approximately 8 000 to 128 000 ICs (chips) are implemented on the wafer if its diameter is, for instance, 8.0 inches, amounting to a usable area of approximately 32 000 mm$^2$ for ICs. The measures according to the invention can, however, also be applied in wafers with a diameter of 4.0, 5.0, 6.0 and 12.0 inches. These and other aspects of the invention are apparent from and will be elucidated with reference to the embodiments described hereinafter.

The invention is described further below with reference to an embodiment illustrated in the drawings, to which embodiment the invention is, however, not restricted.

Figure 1:
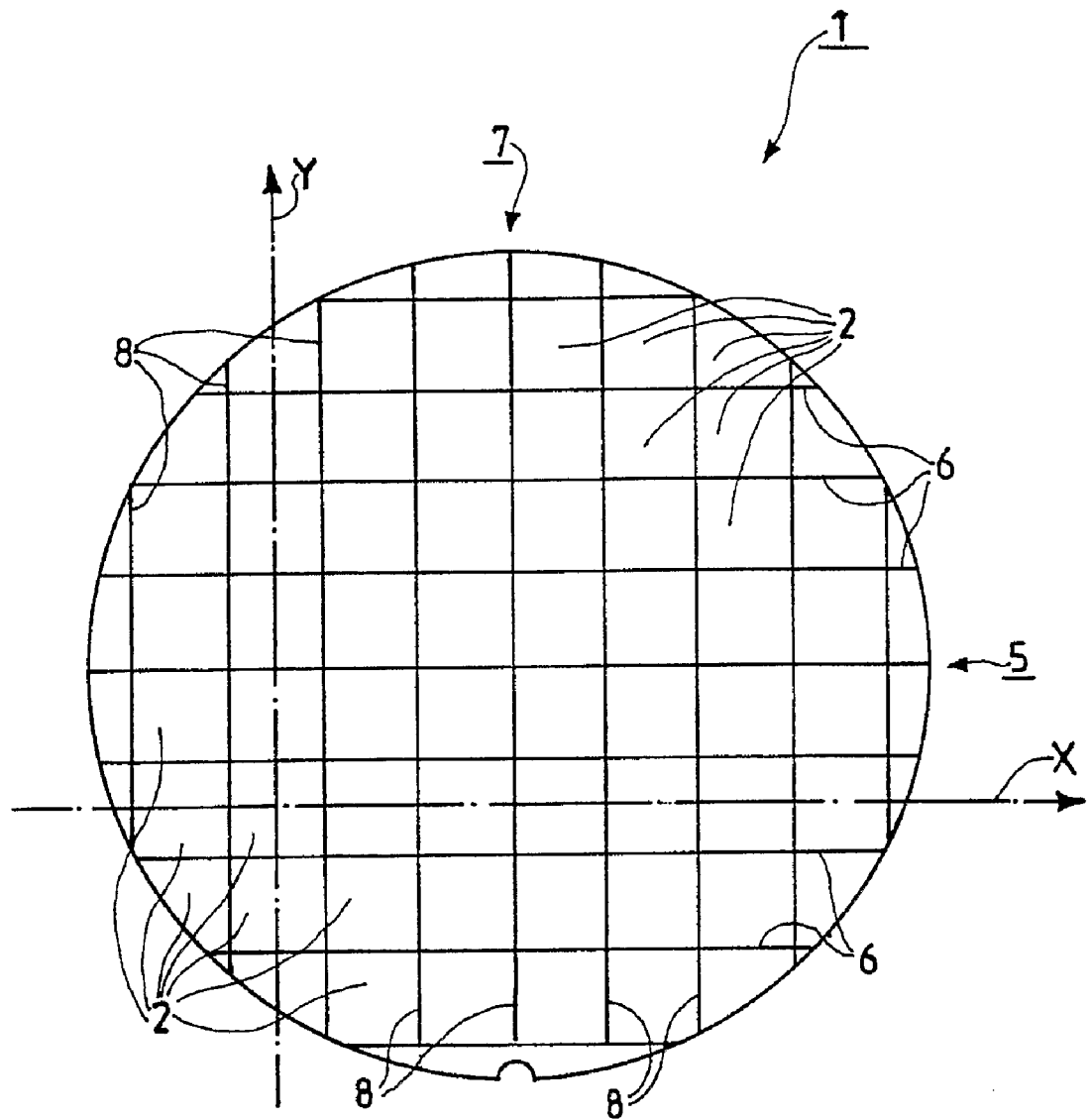
FIG. 1 is a diagrammatic top view of a wafer according to an embodiment of the invention.

FIG. 1 shows a wafer 1. The wafer 1 has semi-conductor characteristics in the known way. The wafer 1 is based on silicon. The wafer 1 can, however, alternatively be based on a polymer to obtain so-called polymer ICs with the aid of the wafer.

Figure 2:
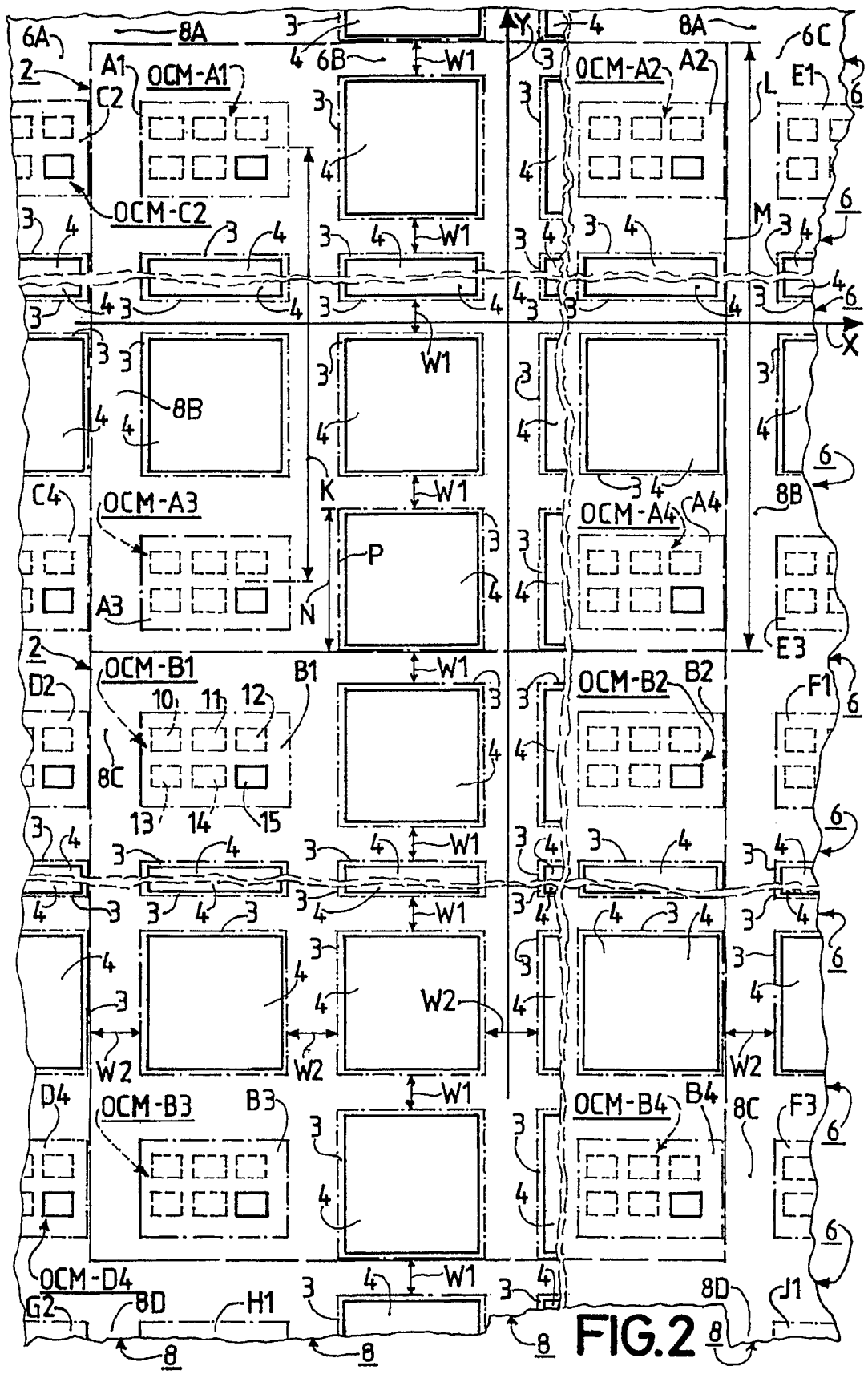
FIG. 2 is a section of the wafer according to FIG. 1, which is considerably enlarged compared to FIG. 1.

The wafer 1 comprises a number of exposure fields 2. In FIG. 1, the exposure fields 2 are shown without the components they contain. FIG. 2 only shows two complete exposure fields 2 by means of broken lines. As FIG. 2 illustrates, the wafer 1 has a number of intersecting and lattice-like dicing path sections 6A, 6B, 6C, 8A, 8B 8C, 8D in each exposure field 2. The wafer 1 further comprises a number of lattice fields 3 between the dicing path sections 6A, 6B, 6C, 8A, 8B 8C, 8D, wherein each lattice field 3 contains one IC 4. Each IC 4 includes a plurality of IC components as has been known for a long time. The IC components are not shown in FIGS. 1 and 2. Small areas of each IC 4 do not contain any IC components.

The wafer 1 comprises a first group 5 of first dicing paths 6 and a second group 7 of second dicing paths 8. All of the first dicing paths 6 of the first group 5 run parallel to a first direction X indicated by a dot-dash line in FIG. 1. All of the second dicing paths 8 of the second group 7 run parallel to a second direction Y intersecting the first direction X and likewise indicated by a dot-dash line in FIG. 1. In the wafer 1, the first direction X and the second direction Y intersect at right angles. This is, however, not absolutely necessary, and the two directions X and Y can intersect at an angle other than 90°, for instance at an angle of 85°, 80°, 75° or 70°. All of the first dicing paths 6 have a first path width W1. All of the second dicing paths 8 have a path width W2. In the wafer 1, the two path widths W1, W2 are different, the first path width W1 being less than the second path width W2. This is, however, not absolutely necessary, and the two path widths W1 and W2 may be equal, which is usually preferred. It is also possible to choose a first path width W1 larger than the second path width W2. The first dicing paths 6 comprise several first dicing path sections 6A, 6B, 6C arranged consecutively in the first direction X, while the second dicing paths 8 comprise several second dicing path sections 8A, 8B, 8C, 8D arranged consecutively in the second direction Y. The first dicing paths 6 and the second dicing paths 8 are provided and designed for the subsequent segregation of the lattice fields 3 and thus of the ICs contained therein.

With regard to the dicing paths, it should here be mentioned that in a wafer wherein the first dicing paths and the second dicing paths intersect at an angle other than 90°, a third group of third dicing paths can be provided, resulting in a wafer with triangular lattice fields and triangular ICs. In this case, the design can be so chosen that the dicing paths of the three groups intersect at an angle of 60°, giving the lattice fields and the ICs the planar shape of an equilateral triangle. This is, however, not necessary, because other angular relationships and thus other triangle shapes are feasible as well. The first, second and third dicing paths can have equal or different path widths.

The wafer 1 comprises control module fields, each of which contains an optical control module. The provision of optical control modules on a wafer as such has been known for some time. These optical control modules contain square or rectangular interference fields detectable, depending on size, either by the naked eye or by computer-aided detection devices and used for mask adjustment and layer thickness testing. The design of the control module fields and the optical control modules contained therein in the wafer 1 according to FIG. 1 is described in detail below with reference to FIG. 2.

In the wafer 1 according to FIGS. 1 and 2, four control module fields A1, A2, A3, A4, B1, B2, B3, B4, C2, C4, D2, D4, E1, E3, F1, F3, G2, H1, J1 are assigned to each exposure field 2. Each of the control module fields A1, A2, A3, A4, B1, B2, B3, B4, C2, C4, D2, D4, E1, E3, F1, F3, G2, H1, J1 runs parallel to the first direction X and thus to the first dicing paths 6. Each of the control module fields A1, A2, A3, A4, B1, B2, B3, B4, C2, C4, D2, D4, E1, E3, F1, F3, G2, H1, J1 contains an optical control module. An optical control module of this type has a known three-dimensional structure, because a control module; component is implemented in each process step, with the result that at least a control module component of an optical control module which is implemented in a last process step is visible from outside of the wafer 1 or detectable by means of a computer-based detection device, whereas any control module components of a control module which have been implemented in a process step executed before the last process step are not visible or detectable from outside of the wafer. In FIG. 2, the control modules in the control module fields A1, A2, A3, A4, B1, B2, B3, B4, C2, D4 are identified by the reference numbers OCM-A1, OCM-A2, OCM-A3, OCM-A4, OCM-B1, OCM-B2, OCM-B3, OCM-B4, OCM-C2, OCM-D4. Reference numbers for the control module components are only entered for the optical control module OCM-B1 in FIG. 2. The control module components located deeper inside the wafer 1 and therefore less visible from outside of the wafer 1 and indicated by broken lines have been given the reference numbers 10, 11, 12, 13 and 14. The control module component located higher in the wafer 1 and therefore visible from outside of the wafer 1 and indicated by a continuous line has been given the reference numbers 15.

As FIG. 2 indicates, the four control module fields A1, A2, A3, A4, B1, B2, B3, B4, C2, C4, D2, D4, E1, E3, F1, F3, G2, H1, J1 of each exposure field 2 are located within the exposure field 2 in question. Each exposure field 2 is rectangular, and each control module field A1, A2, A3, A4, B1, B2, B3, B4, C2, C4, D2, D4, E1, E3, F1, F3, G2, H1, J1 is located in a corner region of the rectangular exposure field 2 in question. As FIG. 2 further indicates, the control module fields A1, A2, A3, A4, B13, B2, B3, B4, C2, C4, D2, D4, E1, E3, F1, F3, G2, H1, J1 of each exposure field 2, which are arranged consecutively in the second direction Y if viewed in the second direction Y, are arranged at an average distance K from one another. In the present case, this average distance K is equal to the whole side length L of a side M of an exposure field 2 which extends in the second direction Y minus the side length N of a side P of a lattice field 3 which extends in the second direction Y. Though the average distance K may be smaller, it has been found to be advantageous if the average distance K is equal to at least a quarter of the side length L of a side K of an exposure field 2 which extends in the second direction Y.

The wafer 1 offers the great advantage that each control module field A1, A2, A3, A4, B1, B2, B3, B4, C2, C4, D2, D4, E1, E3, F1, F3, G2, H1, J1 is located within an exposure field 2, so that no space is required for the control module fields A1, A2, A3, A4, B1, B2, B3, B4, C2, C4, D2, D4, E1, E3, F1, F3, G2, H1, J1 outside of the exposure fields 2, with the result that the dicing paths 6 running parallel to the first direction X can be designed particularly narrow and are therefore designed narrow. In a wafer 1 according to FIGS. 1 and 2, all dicing paths 6 have a first path width W1 of 50 µm. The first path width W1 may alternatively be 60 µm or 70 µm or 40 µm or even less, for instance 30 µm or 20 µm or in future technologies even only 10 µm, because the first path width W1 is in the present case exclusively determined by the cutting or separation equipment with which the wafer is cut or divided to segregate the ICs.

With regard to the control modules OCM-A1, OCM-A2, OCM-A3, OCM-A4, OCM-B1, OCM-B2, OCM-B3, OCM-B4, OCM-C2, OCM-D4, it should finally be mentioned that the control modules OCM-A1, OCM-A2, OCM-A3, OCM-A4, OCM-B1, OCM-B2, OCM-B3, OCM-B4, OCM-C2, OCM-D4 preferably have the dimensions stated below, i.e. a dimension of approximately 500.0 µm in the first direction X and a dimension of approximately 600.0 µm in the second direction Y. Actual dimensions depend on the technology used.

In the wafer 1, the surface areas of the ICs 4 are slightly smaller than those of the lattice fields 3. The surface areas of the ICs 4 may, however, be equal to the surface areas of the lattice fields 3 if preferred.

In the wafer 1, each control module field A1, A2, A3, A4, B13, B2, B3, B4, C2, C4, D2, D4, E1, E3, F1, F3, G2, H1, J1 provided in each exposure field 2 is provided in place of a lattice field 3. As an alternative, each control module field A1, A2, A3, A4, B11, B2, B3, B4, C2, C4, D2, D4, E1, E3, F1, F3, G2, H1, J1 in an exposure field 2 can replace two, three, four or even more lattice fields 3.

In a wafer according to the invention, three or two control module fields or alternatively five, six or more control module fields can be provided instead of a total of four control module fields per exposure field for optimum adaptation to the chosen chip size. The number of control modules is determined by the technology used in the production of the wafer and of the ICs located thereon.

It can finally be mentioned that the wafer 1 further includes so-called process control modules (PCMs) located in the second dicing paths 8 running parallel to the second direction Y. A solution as described in patent specification WO 02/069.389 A2 can, however, be provided as an alternative.

The invention claimed is:

1. A wafer, which wafer comprises a number of exposure fields and which wafer comprises a number of lattice fields in each exposure field, wherein each lattice field contains an IC, and which wafer comprises a first group of dicing paths and a second group of second dicing paths, wherein all of the first dicing paths of the first group run parallel to a first direction and have a first path width and wherein all of the second dicing paths of the second group run parallel to a second direction intersecting the first direction and have a second path width and wherein the first dicing paths and the second dicing paths are provided and designed for a subsequent segregation of the lattice fields and the ICs contained therein, and wherein in each exposure field at least two control module fields are provided such that the control module fields do not reside in any of the dicing paths, each of which control module fields contains at least one optical control module, and wherein each control module field provided in an exposure field is provided in place of a preset number of lattice fields and wherein the at least two control module fields of each exposure field are arranged at an average distance from one another extending in the second direction which average distance is equal to at least a quarter of the side length of a side of the exposure field which extends in the second direction.

2. A wafer as claimed in claim 1, wherein the average distance is equal to the whole side length of a side of the exposure field which extends in the second direction minus the side length of a side of a lattice field which extends in the second direction.

3. A wafer as claimed in claim 1, wherein each exposure field is designed rectangular, and wherein four control module fields are provided in each exposure field, and wherein each control module field is located in a corner region of the exposure field in question.

4. A wafer as claimed in claim 1, wherein each control module field, provided in an exposure field is provided in place of one lattice field only.

5. A wafer as claimed in claim 1, wherein the dicing paths are free of any control module fields.

6. A wafer as claimed in claim 1, wherein the dicing path widths are determined solely by equipment used to segregate the wafer.

7. A wafer as claimed in claim 1, further comprising a third group of dicing paths that run parallel to a third direction intersecting both the first direction and the second direction.

* * * * *